(12) United States Patent
Kimura et al.

(10) Patent No.: US 9,153,575 B2
(45) Date of Patent: Oct. 6, 2015

(54) SEMICONDUCTOR DEVICE

(71) Applicants: Keisuke Kimura, Nagakute (JP); Satoru Kameyama, Toyota (JP); Masaki Koyama, Nukata-gun (JP); Sachiko Aoi, Nagoya (JP)

(72) Inventors: Keisuke Kimura, Nagakute (JP); Satoru Kameyama, Toyota (JP); Masaki Koyama, Nukata-gun (JP); Sachiko Aoi, Nagoya (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/373,992

(22) PCT Filed: Jan. 23, 2013

(86) PCT No.: PCT/IB2013/000072
§ 371 (c)(1),
(2) Date: Jul. 23, 2014

(87) PCT Pub. No.: WO2013/110994
PCT Pub. Date: Aug. 1, 2013

(65) Prior Publication Data
US 2014/0361333 A1    Dec. 11, 2014

(30) Foreign Application Priority Data
Jan. 24, 2012    (JP) ................. 2012-011935

(51) Int. Cl.
| | |
|---|---|
| H01L 29/66 | (2006.01) |
| H01L 27/06 | (2006.01) |
| H01L 29/739 | (2006.01) |
| H01L 29/08 | (2006.01) |
| H01L 29/40 | (2006.01) |
| H01L 29/861 | (2006.01) |
| H01L 29/06 | (2006.01) |

(52) U.S. Cl.
CPC ........ *H01L 27/0664* (2013.01); *H01L 29/0646* (2013.01); *H01L 29/0834* (2013.01); *H01L 29/407* (2013.01); *H01L 29/7395* (2013.01); *H01L 29/7397* (2013.01); *H01L 29/861* (2013.01)

(58) Field of Classification Search
USPC ......................................... 257/140
See application file for complete search history.

(56) References Cited

U.S. PATENT DOCUMENTS

2008/0315248 A1    12/2008  Tokura et al.
2013/0087829 A1*    4/2013  Tanabe et al. ............. 257/140

FOREIGN PATENT DOCUMENTS

| JP | 11-345969 A | 12/1999 |
|---|---|---|
| JP | 2006-173289 A | 6/2006 |
| JP | 2007-288158 A | 11/2007 |
| JP | 2009-176772 A | 8/2009 |
| WO | 2012/001967 A1 | 1/2012 |

* cited by examiner

*Primary Examiner* — Yasser A Abdelaziez
*Assistant Examiner* — Hajar Kolahdouzan
(74) *Attorney, Agent, or Firm* — Kenyon & Kenyon LLP

(57) ABSTRACT

When a semiconductor substrate of a semiconductor device is viewed from above, an isolation region, an IGBT region, and a diode region are all formed adjacent to each other. A deep region that is connected to a body region and an anode region is formed in the isolation region. A drift region is formed extending across the isolation region, the IGBT region, and the diode region, inside the semiconductor substrate. A collector region that extends across the isolation region, the IGBT region and the diode region, and a cathode region positioned in the diode region, are formed in a region exposed on a lower surface of the semiconductor substrate. A boundary between the collector region and the cathode region is in the diode region, in a cross-section that cuts across a boundary between the isolation region and the diode region, and divides the isolation region and the diode region. The collector region formed in the isolation region has a higher dopant impurity concentration than the collector region in the IGBT region.

3 Claims, 16 Drawing Sheets

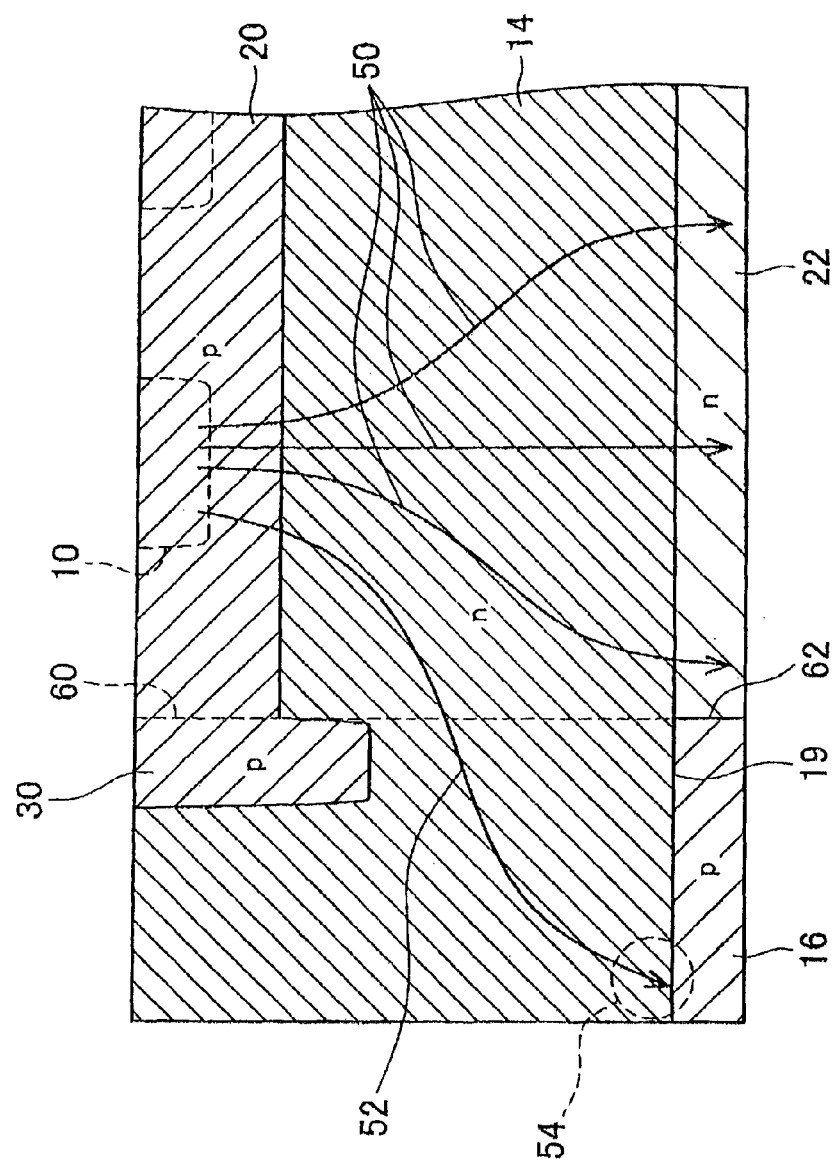

SEMICONDUCTOR DEVICE

CROSS-REFERENCE TO RELATED APPLICATIONS

This is a national phase application based on the PCT International Patent Application No. PCT/IB2013/000072 filed Jan. 23, 2013, claiming priority to Japanese patent application No. 2012-011935 filed Jan. 24, 2012, the entire contents of both of which are incorporated herein by reference.

BACKGROUND OF THE INVENTION

1. Field of the Invention

The invention relates to a semiconductor device provided with a diode and an Insulated Gate Bipolar Transistor (IGBT).

2. Description of Related Art

A semiconductor device provided with a diode and an IGBT is known. Such a semiconductor element is typically referred to as a Reverse Conducting IGBT (RC-IGBT). FIG. 14 is a sectional view of a typical RC-IGBT. When the IGBT of the RC-IGBT is turned on, a snapback phenomenon occurs. FIG. 15 is a view showing a change in a collector current Ic when a voltage Vce between a collector and an emitter (hereinafter also referred to as simply "voltage Vce" or "collector—emitter voltage Vce") is gradually increased, while a voltage of equal to or greater than a threshold value is being applied to a gate electrode 400 of an RC-IGBT in FIG. 14 (i.e., while a gate is on). When the voltage Vce is gradually increased, only a small amount of the current Ic flows, as indicated by the arrow 500 in FIG. 15. This is because electrons supplied from an emitter region 410 of the IGBT to a drift region 430 through a body region 420 (i.e., a channel) flow toward a cathode 450 of a diode, as indicated by the arrow 550 in FIG. 14. Therefore, the voltage applied to a pn junction 442 between the drift region 430 and the collector region 440 is lower than the collector—emitter voltage Vce. Therefore, as shown in FIG. 15, the pn junction will not turn on even when the voltage Vce reaches an on-voltage Vth of the pn junction. The voltage Vce increases to a higher voltage than the voltage Vth, as indicated by the arrow 500 in FIG. 15. When the voltage Vce increases to a predetermined voltage Vp, the voltage applied to the pn junction 442 at this point reaches the on-voltage Vth and the pn junction 442 turns on. That is, holes flow from the collector region 440 into the drift region 430, and electrodes flow via the collector region 440 as indicated by the arrow 560 in FIG. 14. When the pn junction 442 turns on, the voltage Vce suddenly decreases and the current Ic suddenly increases, as indicated by arrow 510 in FIG. 15. This kind of snapback leads to an increase in loss.

Japanese Patent Application Publication No. 2007-288158 (JP 2007-288158 A) describes technology that prevents this snapback phenomenon by adjusting parameters such as the thickness, width, and resistivity and the like of each semiconductor layer in an RC-IGBT. However, these parameters greatly affect other characteristics and manufacturing conditions and the like of the RC-IGBT. Therefore, these parameters cannot be set only to prevent the snapback phenomenon. The invention thus provides a semiconductor device that inhibits the snapback phenomenon.

SUMMARY OF THE INVENTION

A first aspect of the invention relates to a semiconductor device that includes a semiconductor substrate that includes an isolation region, an IGBT region that contacts the isolation region, and a diode region that contacts the isolation region and the IGBT region, the isolation region, the IGBT region, and the diode region being formed on an upper surface of the semiconductor substrate; an n-type emitter region, and a p-type body region that extends to below the emitter region, the n-type emitter region and the p-type body region being formed in the IGBT region; a p-type anode region formed in the diode region; a p-type deep region that is connected to the body region and the anode region, and extends lower than both the body region and the anode region, and is formed in the isolation region; an n-type drift region that extends across the isolation region, the IGBT region, and the diode region, and that is positioned lower than the body region and separated from the emitter region by the body region in the IGBT region, and that is positioned lower than the anode region in the diode region, and that is positioned lower than the deep region in the isolation region, and is formed inside the semiconductor substrate; a gate electrode that opposes, via an insulating film, the body region in an area separating the emitter region from the drift region, and that is formed in the IGBT region; and a p-type collector region that extends across the isolation region, the IGBT region and the diode region, and an n-type cathode region positioned in the diode region, the p-type collector region and the n-type cathode region being formed in a region exposed on a lower surface of the semiconductor substrate, wherein a boundary between the collector region and the cathode region is in the diode region, in a cross-section that cuts across a boundary between the isolation region and the diode region, and divides the isolation region and the diode region.

According to this aspect, the snapback phenomenon can be inhibited from occurring.

A second aspect of the invention relates to a semiconductor device that includes a semiconductor substrate that includes an isolation region, an IGBT region that contacts the isolation region, and a diode region that contacts the isolation region and the IGBT region, the isolation region, the IGBT region, and the diode region being formed on an upper surface of the semiconductor substrate; an n-type emitter region, and a p-type body region that extends to below the emitter region, the n-type emitter region and the p-type body region being formed in the IGBT region; a p-type anode region formed in the diode region; a p-type deep region that is connected to the body region and the anode region, and extends lower than both the body region and the anode region, and is formed in the isolation region; an n-type drift region that extends across the isolation region, the IGBT region, and the diode region, and that is positioned lower than the body region and separated from the emitter region by the body region in the IGBT region, and that is positioned lower than the anode region in the diode region, and that is positioned lower than the deep region in the isolation region, and is formed inside the semiconductor substrate; a gate electrode that opposes, via an insulating film, the body region in an area separating the emitter region from the drift region, and that is formed in the IGBT region; and a p-type collector region that extends across the isolation region, the IGBT region and the diode region, and an n-type cathode region positioned in the diode region, the p-type collector region and the n-type cathode region being formed in a region exposed on a lower surface of the semiconductor substrate, wherein the emitter region and the body region are formed alternately repeating in one direction on the upper surface of the semiconductor substrate in the IGBT region; and in a region exposed on the upper surface of the semiconductor substrate in the IGBT region, the emitter region is formed along a boundary between the IGBT region and the isolation region that intersects the one direction, in an area contacting the boundary.

According to this aspect, the snapback phenomenon can be inhibited from occurring.

A third aspect of the invention relates to a semiconductor device that includes a semiconductor substrate that includes an isolation region, an IGBT region that contacts the isolation region, and a diode region that contacts the isolation region and the IGBT region, the isolation region, the IGBT region, and the diode region being formed on an upper surface of the semiconductor substrate; an n-type emitter region, and a p-type body region that extends to below the emitter region, the n-type emitter region and the p-type body region being formed in the IGBT region; a p-type anode region formed in the diode region; a p-type deep region that is connected to the body region and the anode region, and extends lower than both the body region and the anode region, and is formed in the isolation region; an n-type drift region that extends across the isolation region, the IGBT region, and the diode region, and that is positioned lower than the body region and separated from the emitter region by the body region in the IGBT region, and that is positioned lower than the anode region in the diode region, and that is positioned lower than the deep region in the isolation region, and is formed inside the semiconductor substrate; a gate electrode that opposes, via an insulating film, the body region in an area separating the emitter region from the drift region, and that is formed in the IGBT region; the n-type cathode region is formed in the diode region, in the region exposed on the lower surface of the semiconductor substrate; the p-type first collector region is formed in the IGBT region, in the region exposed on the lower surface of the semiconductor substrate; and a second collector region having a higher p-type impurity concentration than the first collector region is formed in the isolation region, in the region exposed on the lower surface of the semiconductor substrate.

According to this aspect, the snapback phenomenon can be inhibited from occurring.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 16 is a sectional view corresponding to FIG. 2, of a semiconductor device contemplated by the inventors in the past.

DETAILED DESCRIPTION OF EMBODIMENTS

Figure 7:
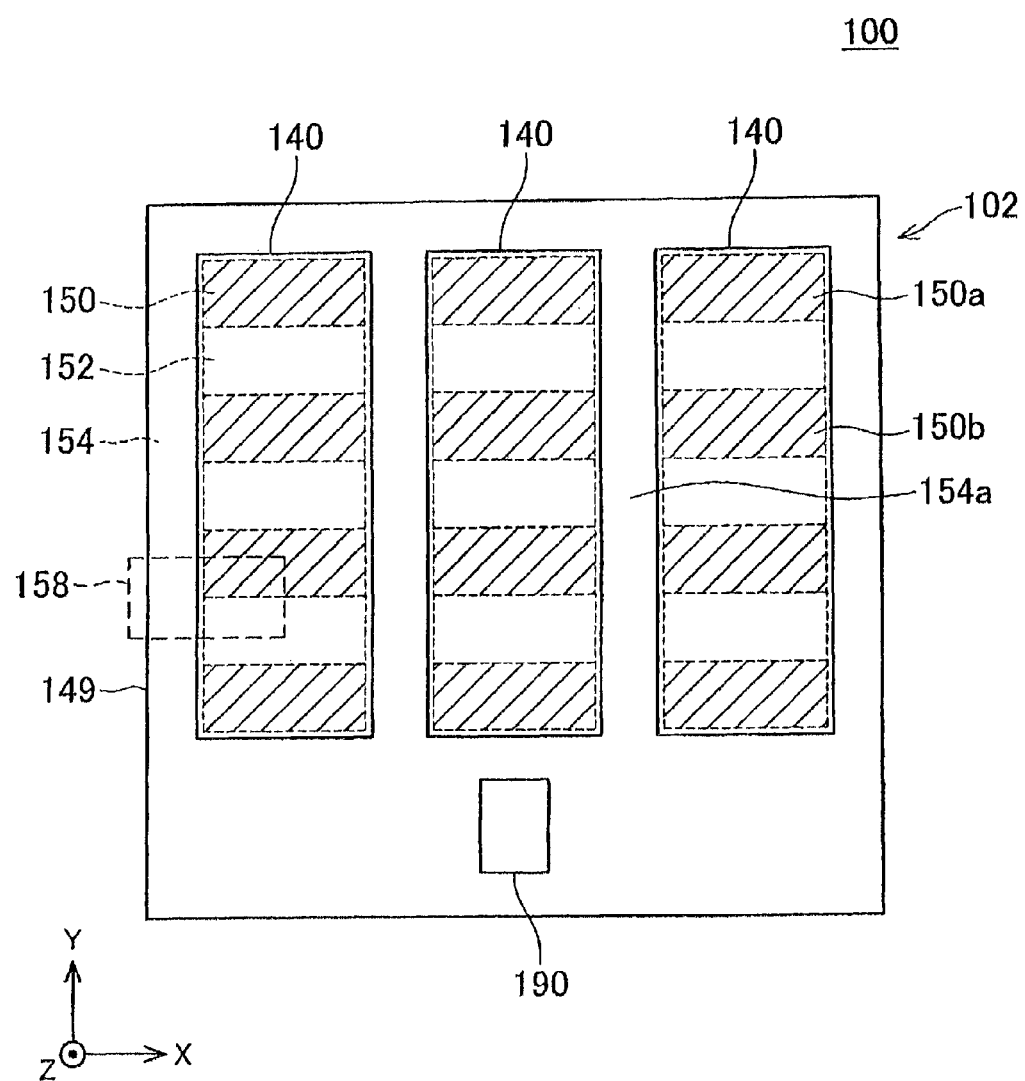
FIG. 7 is a plan view of an RC-IGBT according to a first example embodiment of the invention.

An RC-IGBT 100 according to a first example embodiment of the invention shown in FIG. 7 includes a semiconductor substrate 102, and an electrode and insulating film and the like formed on an upper surface and a lower surface of the semiconductor substrate 102. Hereinafter, a thickness direction of the semiconductor substrate 102 will be referred to as direction Z (Z-direction), one direction along an upper surface of the semiconductor substrate 102 will be referred to as direction X (X-direction), and a direction that is orthogonal to both the X-direction and the Z-direction will be referred to as direction Y (Y-direction). As shown in FIG. 7, three upper electrodes 140 and one bonding pad 190 are formed on the upper surface of the semiconductor substrate 102. An IGBT and a diode are formed on the semiconductor substrate 102 below the upper electrodes 140. In the semiconductor substrate 102 below the upper electrodes 140, the regions with hatching in FIG. 7 are IGBT regions 150 where the IGBT is formed. Also in the semiconductor substrate 102 below the upper electrodes 140, the regions without hatching in FIG. 7 (i.e., the regions enclosed by broken lines) are diode regions 152 where the diode is formed. As shown in the drawing, a plurality of the IGBT regions 150 and a plurality of the diode regions 152 are arranged alternately in the Y-direction below the upper electrodes 140. Also, an isolation region 154 is formed along the entire periphery of a region where one group of the IGBT regions 150 and the diode regions 152 are formed. That is, the IGBT regions 150, the diode regions 152, and the isolation region 154 are all adjacent to each other. The structures of the IGBT regions 150, the diode regions 152, and the isolation region 154 are substantially the same in all locations, so hereinafter the structure in area 158 in FIG. 7 will be described. Also, in this description, regions and the like that are provided in a plurality may be described in the singular to simplify the description.

Figure 8:
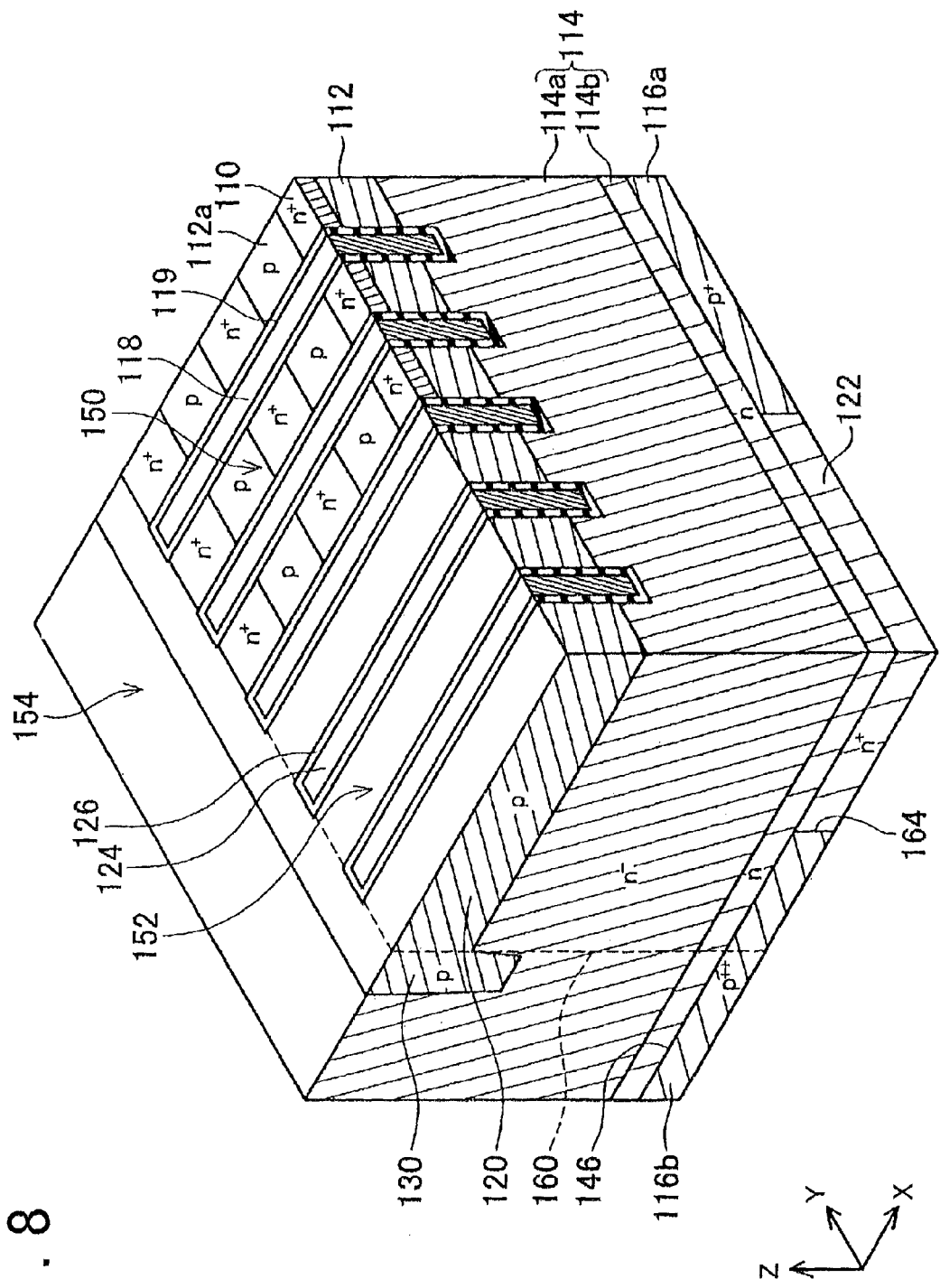
FIG. 8 is a view of an upper surface and a cross-section of the RC-IGBT in area 158 in FIG. 7.

(Structure of the IGBT Region 150) FIG. 8 is a perspective view of the RC-IGBT 100 in area 158. In FIG. 8, the electrodes and insulating films of the RC-IGBT 100 are omitted except for a gate electrode 118, a gate insulating film 119, a trench electrode 124, and an insulating film 126. As shown in FIG. 8, the gate electrode 118, the gate insulating film 119, an emitter region 110, a body region 112, a drift region 114, and a collector region 116a are formed in the IGBT region 150.

Figure 9:
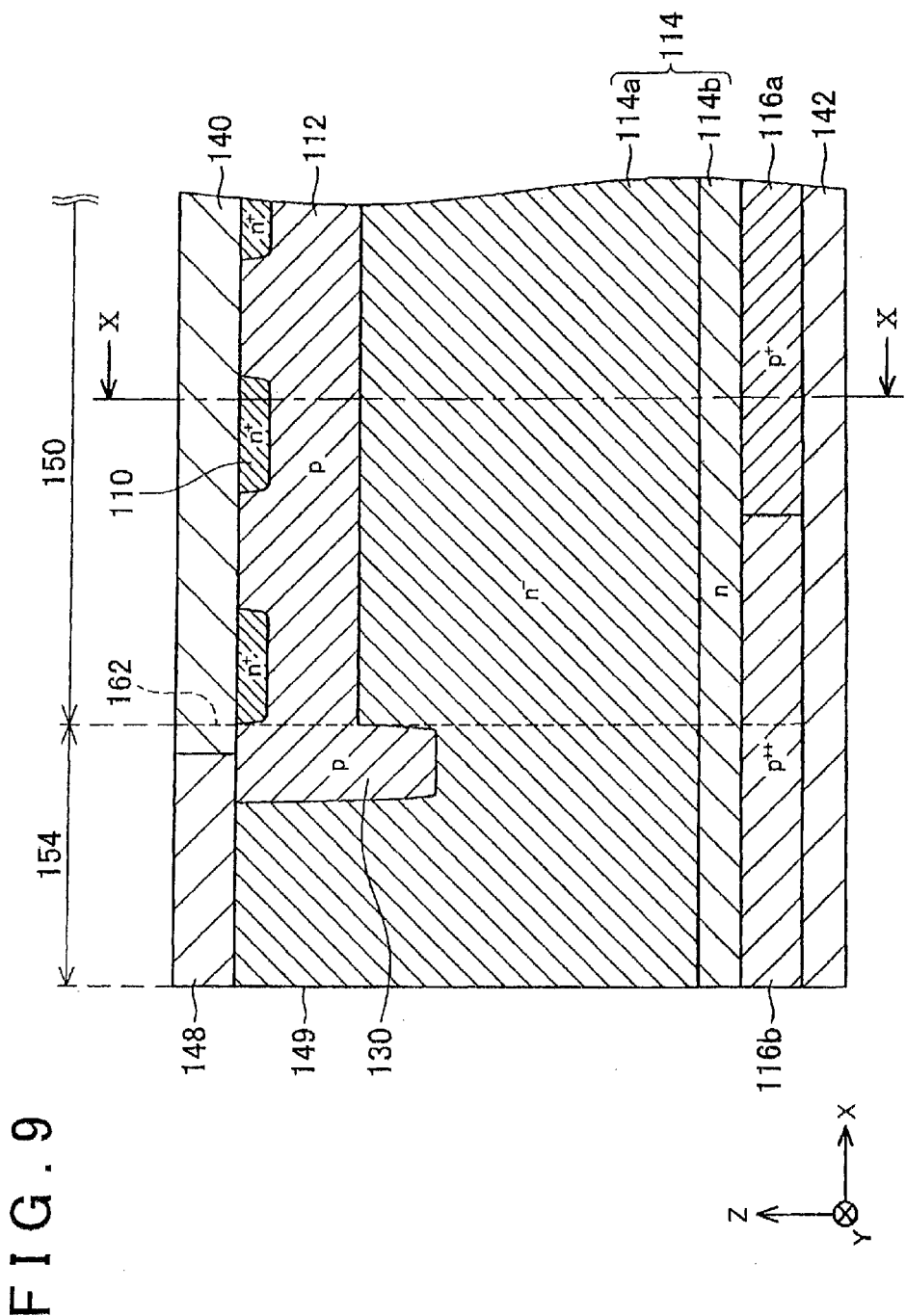
FIG. 9 is a sectional view of an IGBT region (a position that does not include a gate electrode) and an isolation region of the RC-IGBT in FIG. 8 cut along an XZ cross-section (i.e., a sectional view taken along line IX-IX in FIG. 10)
Figure 10:
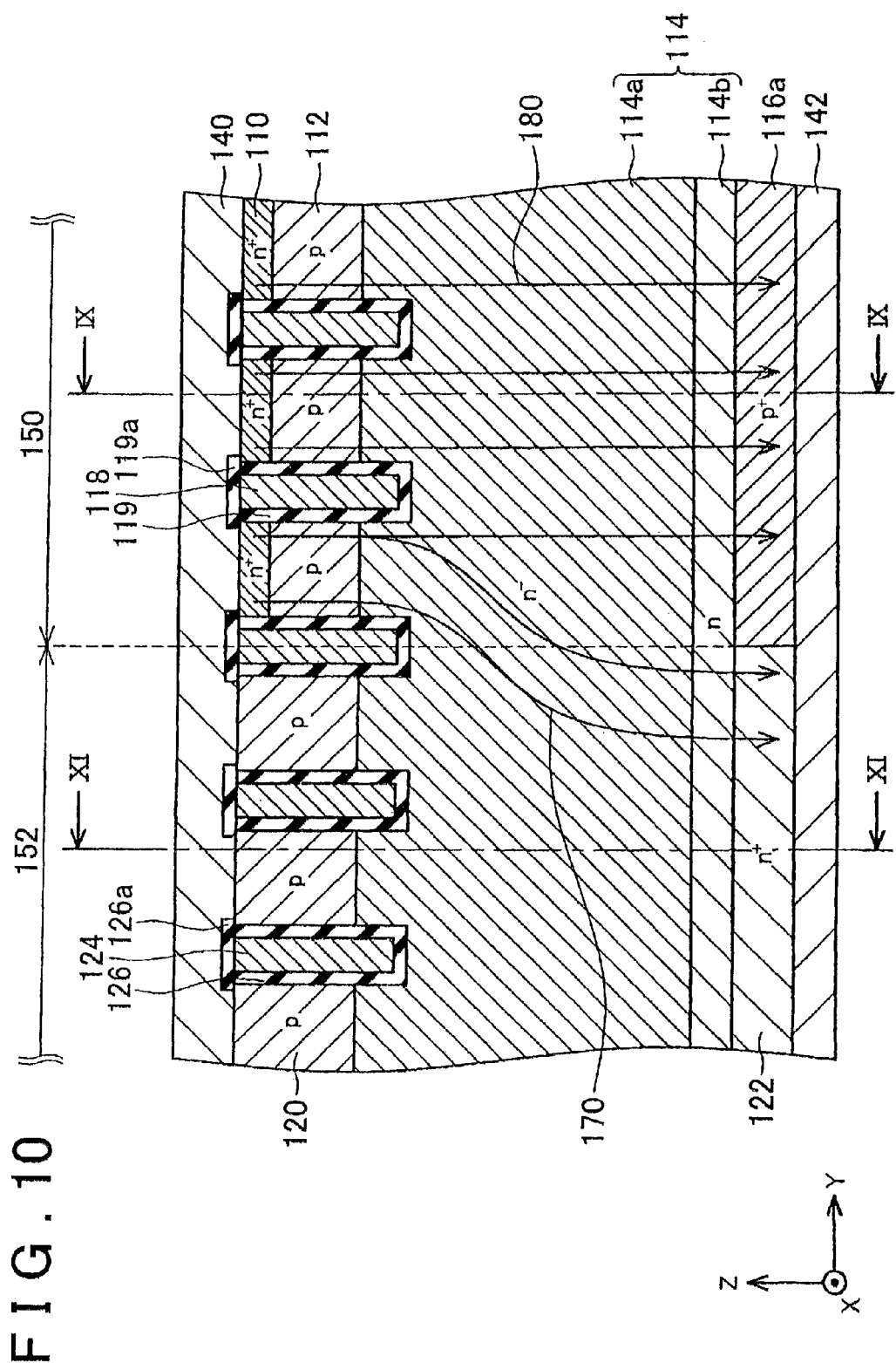
FIG. 10 is a sectional view of an IGBT region and a diode region of the RC-IGBT in FIG. 8 cut along a YZ cross-section (i.e., a sectional view taken along line X-X in FIGS. 9 and 11)

As shown in FIG. 8, the emitter region 110 and the body region 112 are formed in an area exposed on the upper surface of the semiconductor substrate 102. The emitter region 110 and the body region 112 are formed long in the Y-direction in areas exposed on the upper surface of the semiconductor substrate 102. The emitter region 110 and the body region 112 are formed alternating repeatedly in the Y-direction in areas exposed on the upper surface of the semiconductor substrate 102. The emitter region 110 is formed closest to the isolation region 154 side in the IGBT region 150. The emitter region 110 is an n-type region that contains a high concentration of n-type impurities, and is ohmically connected to the upper electrode 140. As shown in FIGS. 8 to 10, the emitter region 110 is formed in an extremely shallow area on the upper surface side of the semiconductor substrate 102. The body region 112 is a p-type region, and is ohmically connected to the upper electrode 140. The body region 112 is formed to a position deeper than the emitter region 110, and covers the lower surface of the emitter region 110.

The drift region 114 includes a low concentration drift region 114a, and a high concentration drift region 114b. The low concentration drift region 114a is an n-type region that contains a low concentration of n-type impurities. The low concentration drift region 14a is formed on the lower side of the body region 112. The low concentration drift region 114a is separated from the emitter region 110 by the body region 112. The high concentration drift region 114b is an n-type region that contains a high concentration of n-type impurities. The high concentration drift region 114b is formed on the lower side of the low concentration drift region 114a.

The collector region 116a is a p-type region that contains a high concentration of p-type impurities. The collector region 116a is formed on the lower side of the high concentration drift region 114b. A lower electrode 142 is formed on substantially the entire region of a lower surface of the semiconductor substrate 102 (see FIG. 9). The collector region 116a is ohmically connected to the lower electrode 142.

The gate electrode 118 and the gate insulating film 119 are arranged in a plurality of trenches formed in the upper surface of the semiconductor substrate 102 in the IGBT region 150. The trenches are formed long in the X-direction, and are formed at equally-spaced intervals in the Y-direction. The trenches pass through the emitter region 110 and the body region 112 and reach to the low concentration drift region 114a. The gate insulating film 119 covers the inside surface of the trenches. The gate electrode 118 is arranged inside the trenches. Therefore, the gate electrode 118 opposes the emitter region 110 and the body region 112 via the gate insulating film 119. An upper surface of the gate electrode 118 is covered by an interlayer insulating film 119a (see FIG. 10). The gate electrode 118 is insulated from the upper electrode 140 by this interlayer insulating film 119a. The gate electrode 118 is wired, not shown, so the potential of the gate electrode 118 is able to be controlled.

(Structure of the Diode Region 152)

Figure 11:
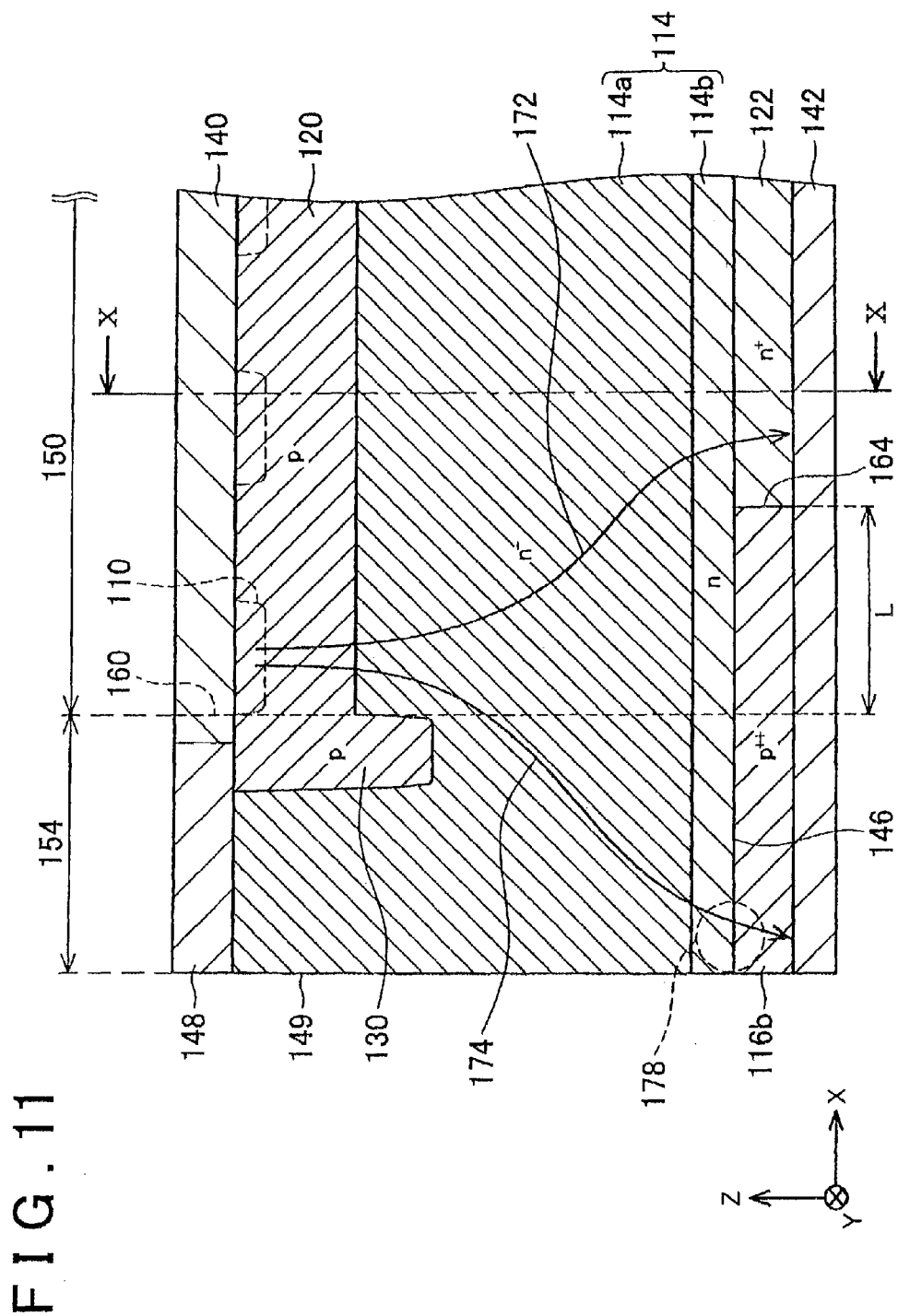
FIG. 11 is a sectional view of a diode region (a position that does not include a gate electrode) and an isolation region of an RC-IGBT in FIG. 8 cut along an XZ cross-section (i.e., a sectional view taken along line XI-XI in FIG. 10)

As shown in FIGS. 8, 10, and 11, an anode region 120, the drift region 114, a cathode region 122, the trench electrode 124, and the insulating film 126 are formed in the diode region 152.

The anode region 120 is a p-type region that contains a high concentration of p-type impurities. The anode region 120 is formed in an area exposed on the upper surface of the semiconductor substrate 102. The anode region 120 is formed to a depth substantially the same as that of a lower end of the body region 112. The anode region 120 is ohmically connected to the upper electrode 140.

The low concentration drift region 114a described above is formed on the lower side of the anode region 120. The high concentration drift region 114b described above is formed on the lower side of the low concentration drift region 114a.

The cathode region 122 and a high concentration collector region 116b are formed in an area exposed on the lower surface of the semiconductor substrate 102 on the lower side of the high concentration drift region 114b. The high concentration collector region 116b is formed within a width area a distance L from a boundary 160 between the isolation region 154 and the diode region 152, in the diode region 152. The cathode region 122 is formed in a region of the diode region 152 where the high concentration collector region 116b is not formed. The cathode region 122 is an n-type region that contains a high concentration of n-type impurities, and is ohmically connected to the lower electrode 142. The high concentration collector region 116b is a p-type region that contains a higher concentration of p-type impurities than the collector region 116a, and is also ohmically connected to the lower electrode 142.

The trench electrode 124 and the insulating film 126 are arranged in a plurality of trenches formed in the upper surface of the semiconductor substrate 102 in the diode region 152. The trenches are formed long in the X-direction, and are formed at equally-spaced intervals in the Y-direction. The trenches pass through the anode region 120 and reach to the low concentration drift region 114a. The insulating film 126 covers the inside surface of the trenches. The trench electrode 124 is arranged inside the trenches. An upper surface of the trench electrode 124 is covered by an interlayer insulating film 126a. The trench electrode 124 is insulated from the upper electrode 140 by this interlayer insulating film 126a. The trench electrode 124 is designed to optimize the potential distribution in the diode region 152. The trench electrode 124 may be configured such that the potential thereof can be controlled, or it may be floating.

(Structure of the Isolation Region 154)

As shown in FIGS. 8, 9, and 11, a voltage-resistance retaining region 130, the drift region 114, and the insulating film 126 are formed in the isolation region 154.

The voltage-resistance retaining region 130 is a p-type region that is connected to the body region 112 and the anode region 120. The voltage-resistance retaining region 130 extends from the upper surface of the semiconductor substrate 102 to a position deeper than the body region 112 and the anode region 120. That is, in the cross-section shown in FIG. 9, the location where the p-type region abruptly extends to lower than the position of the lower end of the body region 112 is a boundary 162 between the voltage-resistance retaining region 130 and the body region 112, and is also a boundary between the isolation region 154 and the IGBT region 150. More specifically, the voltage-resistance retaining region 130 extends to a position deeper than the gate electrode 118. Therefore, the p-type region that extends from the upper surface of the semiconductor substrate 102 to a position deeper than the gate electrode 118 may also be defined as the voltage-resistance retaining region 130.

As shown in FIGS. 8, 9, and 11, the low concentration drift region 114a described above is formed on the lower side of the voltage-resistance retaining region 130. This low concentration drift region 114a extends farther toward the outside (i.e., a tip end 149 side) than the voltage-resistance retaining region 130, and is exposed on the upper surface of the semiconductor substrate 102 near the tip end 149. The upper surface of the isolation region 154 is covered by an insulating film 148. The high concentration drift region 114b described above is formed on the lower side of the low concentration drift region 114a. That is, the drift region 114 extends across the IGBT region 150, the diode region 152, and the isolation region 154.

The high concentration collector region 116b described above is formed on the lower side of the high concentration drift region 114b. The high concentration collector region 116b is formed over the entire area that is exposed on the lower surface of the semiconductor substrate 102 in the isolation region 154. Also, the high concentration collector region 116b is formed with a portion thereof crossing the boundary 160 between the isolation region 154 and the diode region 152, and extending into the diode region 152 (see FIG. 12). Therefore, as described above, the high concentration collector region 116b is formed partially in the diode region 152. That is, a boundary 164 between the high concentration collector region 116b and the cathode region 122 is shifted toward the diode region 152 side by the distance L from the boundary 160 between the isolation region 154 and the diode region 152.

Figure 12:
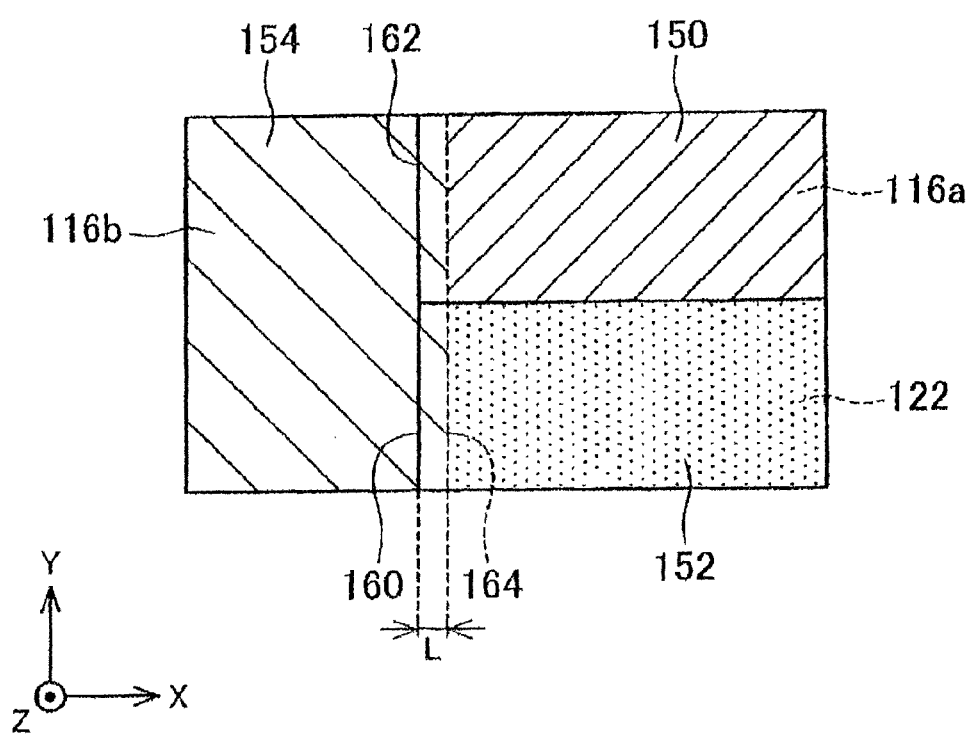
FIG. 12 is a view showing the arrangement of regions when the RC-IGBT in FIG. 8 is viewed from a Z-direction.

FIG. 12 is a view illustrating the positional relationships among the IGBT region 150, the diode region 152, and the isolation region 154, and the collector region 116a, and the cathode region 122, and the high concentration collector region 116b. In FIG. 12, the solid lines indicate the boundaries between the IGBT region 150, the diode region 152, and the isolation region 154. Also, the hatching indicates the collector region 116a, the cathode region 122, and the high concentration collector region 116b. The boundary 164 between the high concentration collector region 116b and the cathode region 122 extends into the diode region 152 along the boundary 160, at a position the distance L from the boundary 160 between the isolation region 154 and the diode region 152. Also, when the collector region 116a and the high concentration collector region 116b are regarded as a single collector region, this collector region extends across the IGBT region 150, the diode region 152, and the isolation region 154.

(Operation of the RC-IGBT 100)

When a voltage equal to or greater than a threshold value is applied to the gate electrode 118, a channel is formed in the body region 112 in the area contacting the gate insulating film 119. That is, the gate turns on. In this state, the potential of the lower electrode 142 may gradually be increased with respect to the upper electrodes 140. That is, the collector—emitter voltage Vce may gradually be increased. When the voltage Vce is applied, electrons flow through the channel from the emitter region 110 into the drift region 114, as indicated by arrows 170 in FIG. 10. When the voltage Vce is low, a pn junction between the collector region 116a and the drift region 114 will not turn on. In this state, electrons flow from the drift region 114 to the cathode region 122, as indicated by the arrows 170. Electrons flow from the emitter region 110 that is adjacent in the Y-direction to the anode region 120, toward the cathode region 122, as shown by arrow 172, in the cross-section shown in FIG. 11. Here, with the RC-IGBT 100, the distance L is provided between the boundary 160 between the isolation region 154 and the diode region 152, and the boundary 164 between the high concentration collector region 116b and the cathode region 122. That is, the isolation region 154 is separated from the cathode region 122, so the potential of the drift region 114 in the isolation region 154 rises easily. Therefore, the voltage applied to a pn junction 146 between the drift region 114 and the high concentration collector region 116b in the isolation region 154 increases easily. Also, with the RC-IGBT 100, the emitter region 110 is formed contacting the voltage-resistance retaining region 130, so the emitter region 110 is close to the isolation region 154. Therefore, electrons from the emitter region 110 easily flow into the isolation region 154, as indicated by arrow 174 in FIG. 11. From this as well, the voltage applied to the pn junction 146 in the isolation region 154 increases easily. Moreover, the p-type impurity concentration of the high concentration collector region 116b in the isolation region 154 is high. Accordingly, the on-voltage of the pn junction 146 in the isolation region 154 is low. Therefore, the pn junction 146 in the isolation region 154 (e.g., the pn junction 146 in the area 178 near the tip end 149 in FIG. 11) turns on simply by increasing the voltage Vce slightly. Once the pn junction 146 turns on, the entire pn junction between the entire region that includes the high concentration collector region 116b and the collector region 116a, and the drift region 114 turns on. As a result, electrons flow through the collector region 116a, as indicated by arrows 180 in FIG. 10, so the current rapidly increases. That is, the IGBT turns on. In this way, with the RC-IGBT 100, the IGBT is turned on, which enables the snapback phenomenon to be inhibited, simply by increasing the voltage Vce slightly. Therefore, loss in the IGBT is able to be minimized.

Also, in this first example embodiment, the high concentration collector region 116b is formed mainly in the isolation region 154, and the collector region 116a having a relatively low p-type impurity concentration is formed mostly in IGBT region 150. Therefore, when the IGBT is turned on, the hole concentration in the drift region 114 in the IGBT region 150 will not become extremely high. Accordingly, the short-circuit capacity of the IGBT is ensured.

Also, according to the structure described above, the snapback phenomenon is able to be inhibited by the structure only in the isolation region 154 or near the isolation region 154. That is, the snapback phenomenon is able to be inhibited without noticeably affecting the characteristics of the diode and the IGBT. Also, because there is little effect on the characteristics of the diode and the IGBT in this way, the design of the structure is easy. Therefore, design changes and the like are able to be made easily.

Figure 1:
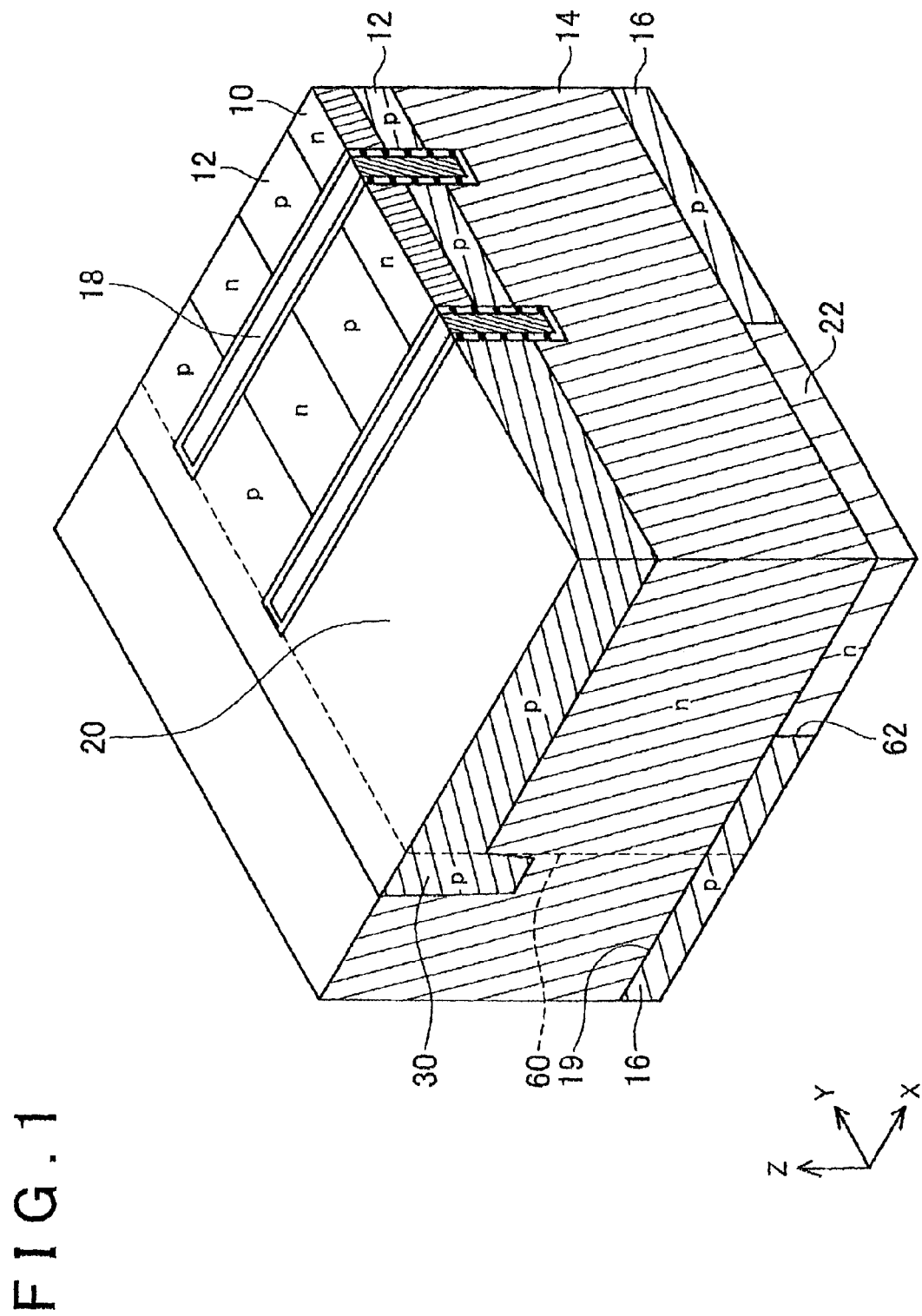
FIG. 1 is a view of an upper surface and a cross-section of a semiconductor device according to a second example embodiment of the invention.
Figure 2:
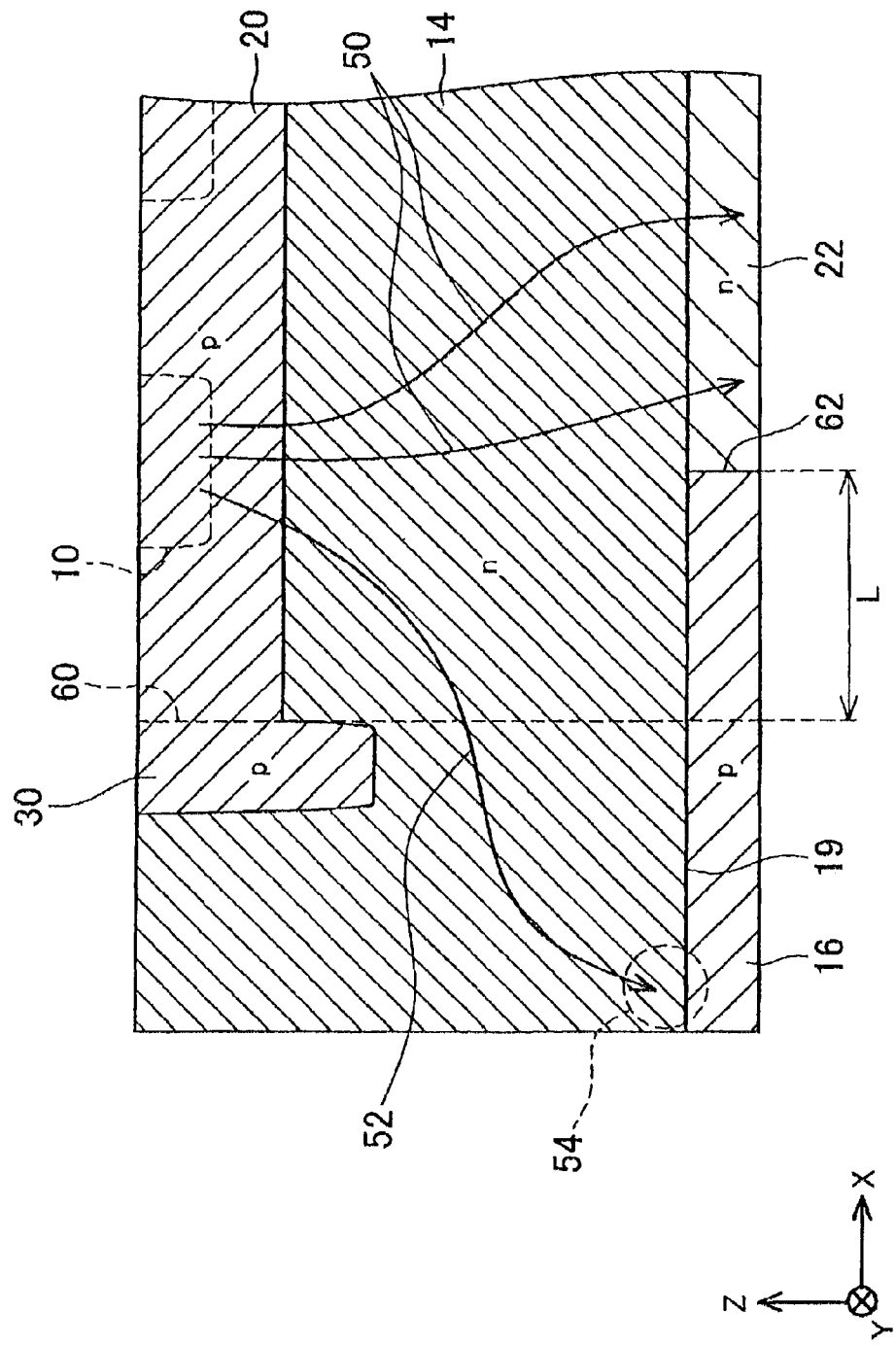
FIG. 2 is a view in which an emitter region is projected in a Y-direction on an XZ cross-section of a diode region of the semiconductor device in FIG. 1.

FIG. 1 is a view of a semiconductor device according to a second example embodiment of the invention. In FIG. 1, an emitter region 10, a body region 12, a drift region 14, a collector region 16, and a gate electrode 18, are all formed in an IGBT region. Also, an anode region 20, a drift region 14, and a cathode region 22, are all formed in a diode region. A deep region 30, the drift region 14, and the collector region 16 are formed in an isolation region. Also, FIG. 2 is a view in which the emitter region 10 is projected in the Y-direction on a cross-section (i.e., a cross-section of the diode region) taken along the XZ plane in FIG. 1. Further, FIG. 16 is a sectional view corresponding to FIG. 2, of a semiconductor device contemplated by the inventors in the past before conceiving the technology described in this specification. For the description, portions in FIG. 16 will be referred to by the same reference characters as those in FIG. 2. With the semiconductor device in FIG. 2, the collector region 16 protrudes from the isolation region into the diode region (i.e., a boundary 62 between the collector region 16 and the cathode region 22 is in the diode region). In contrast, with the semiconductor device in FIG. 16, the cathode region 22 is formed over the entire diode region (i.e., the boundary 62 between the collector region 16 and the cathode region 22 is aligned with the boundary 60 between the isolation region and the diode region). The other structure of the semiconductor device in FIG. 2 is the same as that of the semiconductor device in FIG. 16.

In both of the semiconductor devices in FIGS. 2 and 16, when the collector—emitter voltage Vce is increased while the gate is on, electrons flow from the emitter region 10 toward the nearby cathode region 22, as indicated by arrows 50 in FIGS. 2 and 16. At this time, the voltage applied to a pn junction 19 of the boundary between the collector region 16 and the drift region 14 is higher farther away from the cathode region 22. Therefore, as shown in FIGS. 2 and 16, the voltage applied to the pn junction 19 is higher near an area 54 in the isolation region. If the voltage Vce is increased thereafter, the voltage applied to the pn junction 19 near the area 54 will first reach the on-voltage, and holes will flow from the collector region 16 near the area 54 into the drift region 14. Once holes flow into the drift region 14, the entire pn junction 19 including inside the IGBT region turns on, and a large amount of current flows into the IGBT region. As described above, with the semiconductor device in FIG. 2, the boundary 62 between the collector region 16 and the cathode region 22 is included in the diode region. That is, the boundary 62 shifts toward the diode region side by the distance L from the boundary 60. Therefore, in the semiconductor device in FIG. 2, the area 54 is farther away from the cathode region 22 by the distance L than it is in the semiconductor device in FIG. 16. As a result, in the semiconductor device in FIG. 2, the voltage applied to the pn junction 19 of the area 54 increases easily, so the pn junction 19 will turn on easily. Therefore, with the semiconductor device in FIGS. 1 and 2, the snapback phenomenon is inhibited. The phenomenon in which the pn junction 19 of the semiconductor device in FIGS. 1 and 2 turns on easily may also be described in the manner stated below. As is evident by comparing the arrows 50 in FIGS. 2 and 16, the current that flows from the emitter region 10 to the cathode region 22 when the voltage Vce is low is less in the semiconductor device in FIG. 2. Therefore, in this operation, the number of electrons that flow toward the area 54, as indicated by arrow 52 in FIGS. 2 and 16, is larger with the semiconductor device in FIG. 2. Thus, with the semiconductor device in FIG. 2, the voltage applied to the pn junction 19 of the area 54 increases easily. The pn junction 19 turns on easily, so the snapback phenomenon is inhibited.

Figure 3:
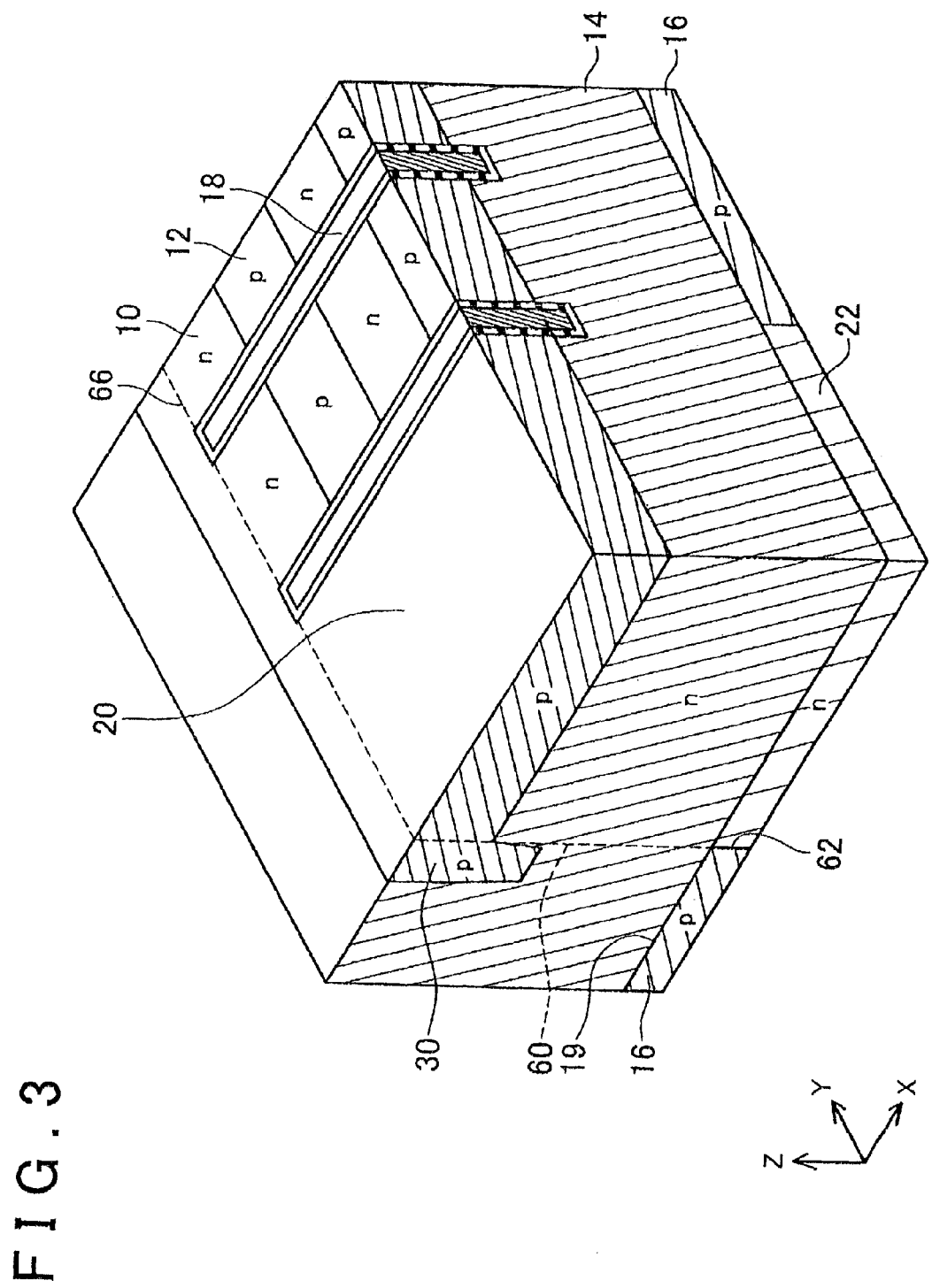
FIG. 3 is a view of an upper surface and a cross-section of a semiconductor device according to a third example embodiment of the invention.
Figure 4:
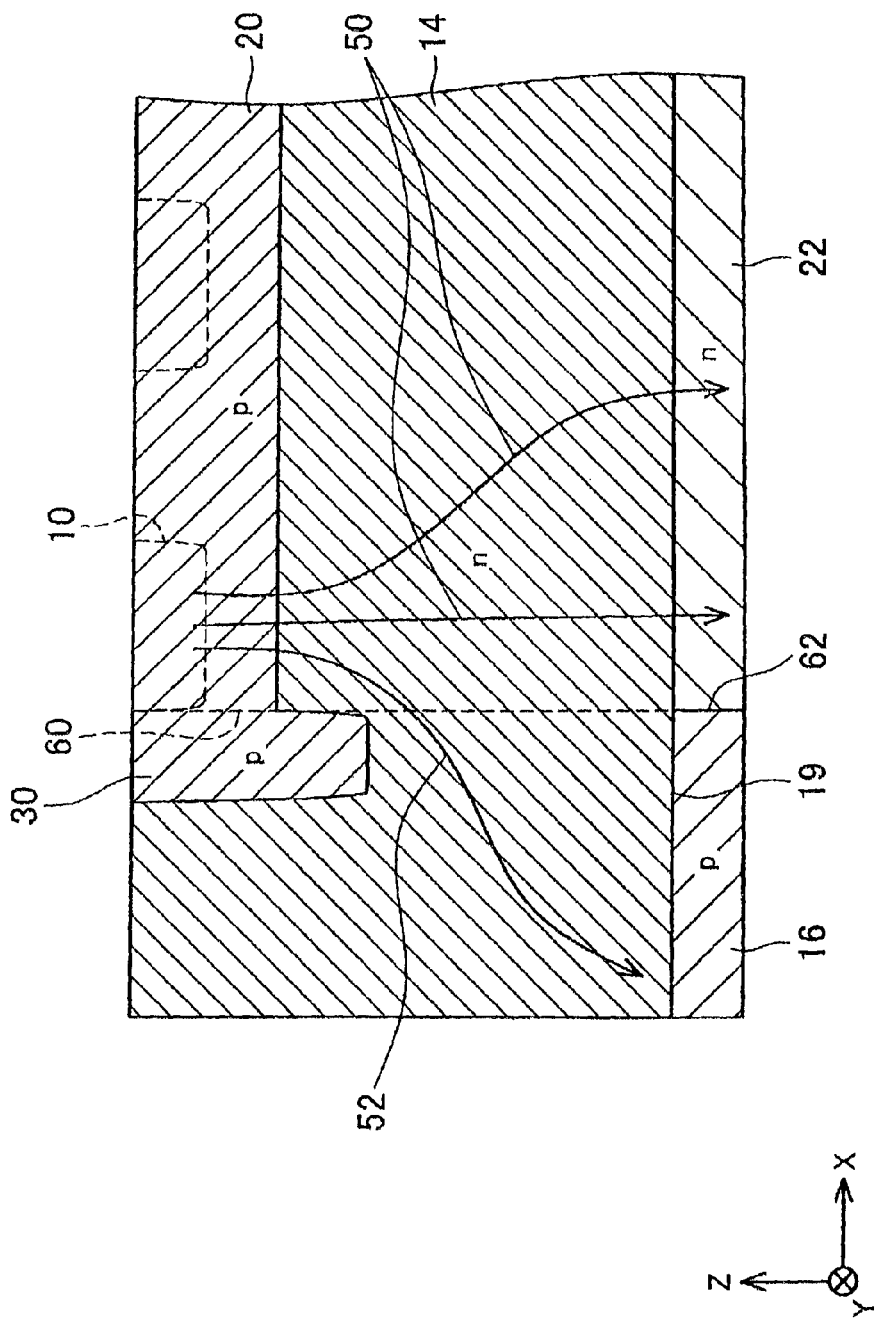
FIG. 4 is a view in which an emitter region is projected in a Y-direction on an XZ cross-section of a diode region of the semiconductor device in FIG. 3.

FIGS. 3 and 4 are views corresponding to FIGS. 1 and 2, of a semiconductor device according to a third example embodiment of the invention. In FIGS. 3 and 4, portions corresponding to the portions in FIGS. 1 and 2 are denoted by the same reference characters as those used in FIGS. 1 and 2. With the semiconductor device in FIGS. 3 and 4, the emitter region 10 and the body region 12 are formed alternating repeatedly in the X-direction, on an upper surface of the semiconductor substrate in the IGBT region. Also, the emitter region 10 is formed along a boundary 66 between an IGBT region and an isolation region that intersects the X-direction, in an area contacting this boundary 66. Also, with the semiconductor device in FIGS. 3 and 4, the distance L in FIGS. 1 and 2 is not provided (however, the distance L may be provided in a semiconductor device according to a modified example of the third semiconductor device).

In the semiconductor device in FIGS. 3 and 4, when the collector—emitter voltage Vce is increased while the gate is on, electrons flow from the emitter region 10 toward the nearby cathode region 22, as indicated by the arrows 50 in FIG. 4. At the same time, electrons flow toward the pn junction 19 in the isolation region, as indicated by the arrow 52 in FIG. 4. As is evident by comparing FIGS. 4 and 16, with the semiconductor device in FIG. 4, the emitter region 10 is closer to the isolation region than it is in the semiconductor device in FIG. 16, so with the semiconductor device in FIG. 4, electrons flow more easily from the emitter region 10, as indicated by the arrow 52. Therefore, in the isolation region, the voltage applied to the pn junction 19 increases more easily, so the pn junction 19 turns on more easily. Therefore, with the semiconductor device in FIGS. 3 and 4, the snapback phenomenon is able to be inhibited.

Figure 5:
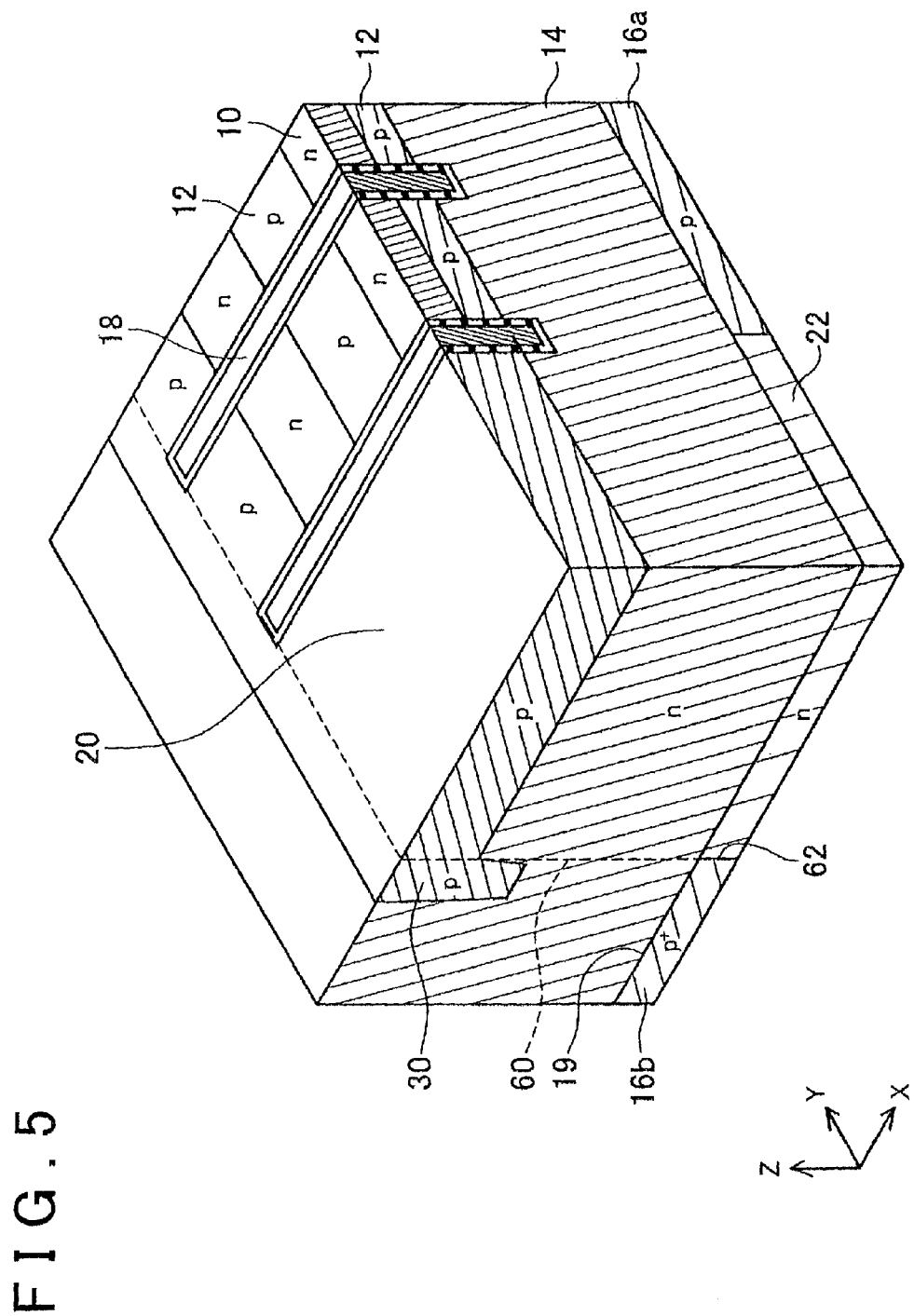
FIG. 5 is a view of an upper surface and a cross-section of a semiconductor device according to a fourth example embodiment of the invention.
Figure 6:
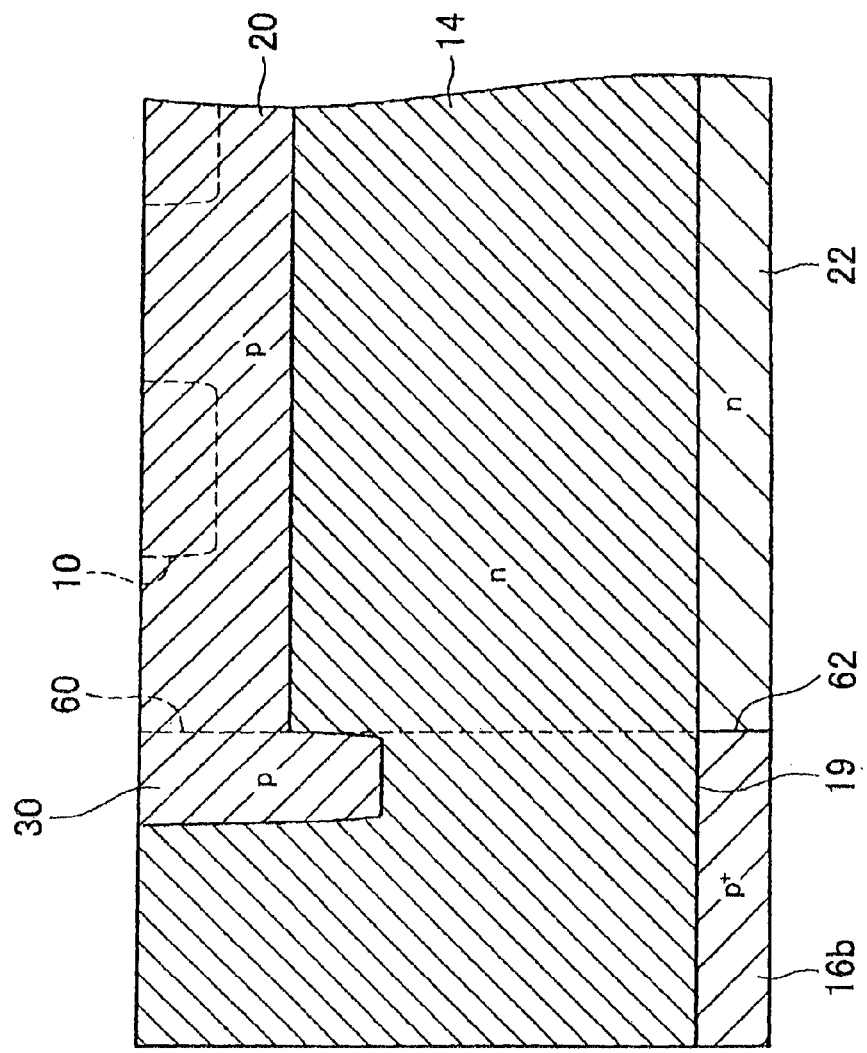
FIG. 6 is a view in which an emitter region is projected in a Y-direction on an XZ cross-section of a diode region of the semiconductor device in FIG. 5.

FIGS. 5 and 6 are views corresponding to FIGS. 1 and 2, of a semiconductor device according to a fourth example embodiment of the invention. In FIGS. 5 and 6, portions corresponding to the portions in FIGS. 1 and 2 are denoted by the same reference characters as those used in FIGS. 1 and 2. Unlike the semiconductor device in FIGS. 1 and 2, with the semiconductor device in FIGS. 5 and 6, a collector region 16b (a second collector region) in an isolation region has a p-type impurity concentration higher than that of a collector region 16a (a first collector region) in an IGBT region. Also, with the semiconductor device in FIGS. 5 and 6, the distance L in FIGS. 1 and 2 is not provided (however, the distance L may be provided in a semiconductor device according to a modified example of the fourth semiconductor device).

In the semiconductor device in FIGS. 5 and 6, when the collector—emitter voltage Vce is increased while the gate is on, the pn junction 19 in the isolation region first turns on. At this time, the p-type impurity concentration of the collector region 16 in the isolation region is high, so the on-voltage of the pn junction 19 in the isolation region (i.e., the minimum voltage necessary to turn on the pn junction 19 in the isolation region) is lower than it is with the semiconductor device in FIG. 16. Therefore, with the semiconductor device in FIGS. 5 and 6, the pn junction 19 in the isolation region turns on more easily. Therefore, with the semiconductor device in FIGS. 5 and 6, the snapback phenomenon is able to be inhibited. If the p-type impurity concentration of the first collector region 16a in the IGBT region becomes too high, the number of holes in the IGBT region will become too large, and the short-circuit capacity of the IGBT will decrease. This problem can be avoided by reducing the p-type impurity concentration in the collector region 16a in the IGBT region so that it is lower than the p-type impurity concentration in the collector region 16b. However, the collector region 16a does not necessarily have to be formed over the entire region in the IGBT region. That is, the collector region 16b may also be formed partially in the IGBT region As described above, with the semiconductor devices according to the second and fourth example embodiments as well, the pn junction between the drift region and the collector region in the isolation region turns on more easily. As a result, the snapback phenomenon is able to be inhibited.

As described above, with all of the semiconductor devices according to the first to fourth example embodiments described in this specification, the fact that the pn junction between the drift region and the collector region in the isolation region turns on easily is a technical feature. The structures of the semiconductor devices according to the second to fourth example embodiments described above are able to obtain advantageous effects independently, but these structures may also be used in combination.

In a modified example of the first example embodiment, the high concentration collector region 16b may be formed only in the isolation region 154, and the collector region 116a may be formed over the entire region in the IGBT region 150. Also, as long as the high concentration collector region 116b is formed in at least a portion of the isolation region 154, it does not necessarily have to be formed in the entire region of the isolation region 154. Also, the p-type impurity concentration in the collector region 116b may be changing. For example, the structure may be such that the p-type impurity concentration of the collector region 116b in the isolation region 154 becomes higher farther away from the diode region 152.

Also, in the example embodiments described above, the structure of a portion that faces the tip end 149 is described. However, a similar structure may also be employed in an isolation region 154a between two active regions in FIG. 7. Also, in the example embodiments described above, the voltage-resistance retaining region 130 is formed partially in the isolation region 154, but the voltage-resistance retaining region 130 may also be formed over the entire isolation region 154 in the cross direction (i.e., the X-direction and the Y-direction) of the isolation region 154.

Also, a structure in which the emitter region 110 contacts the voltage-resistance retaining region 130 may be employed in all of the IGBT regions 150, or only in a portion (one or some) of the IGBT regions 150. For example, this structure may be employed in the IGBT region 150a and not employed in the IGBT region 150b in FIG. 7. Also, this structure may be employed only on the isolation region 154 side that faces the tip end 149 and not employed on the isolation region 154a side between active regions. The reverse is also possible.

Also, the structure in which the boundary 164 is in the diode region 152 may also be employed only with a portion (one or some) of the diode regions 152. Also, this structure may be employed only at a portion in one diode region 152. For example, this structure may be employed only on the isolation region 154 side that faces the tip end 149, and not employed on the isolation region 154a side between active regions. The reverse is also possible.

Further, in the example embodiments described above, there are three upper electrodes 140, but this number may also be changed. Also, the size of each of the upper electrodes 140 may be changed.

Figure 13:
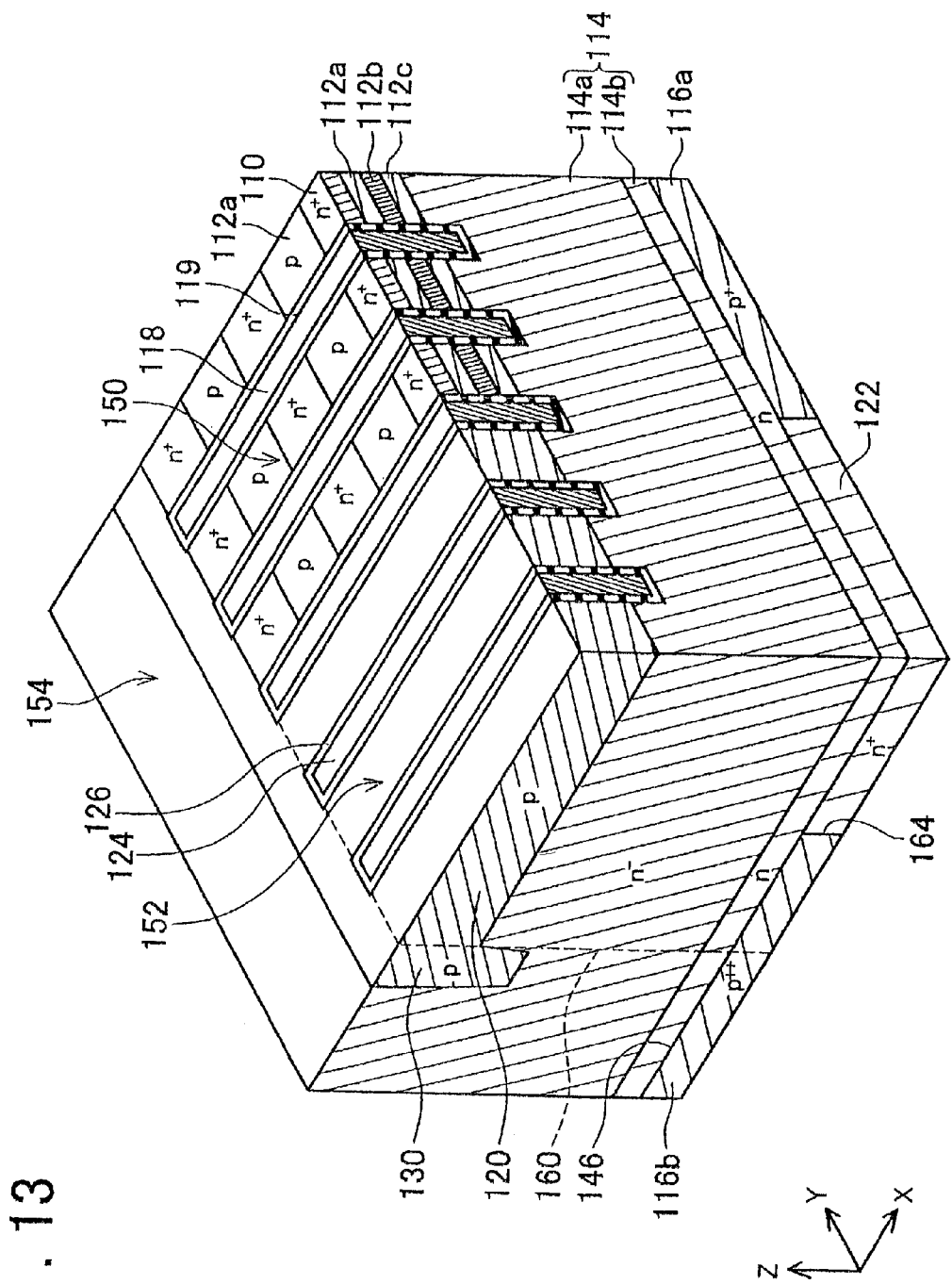
FIG. 13 is a longitudinal sectional view of an RC-IGBT according to a modified example.
Figure 14:
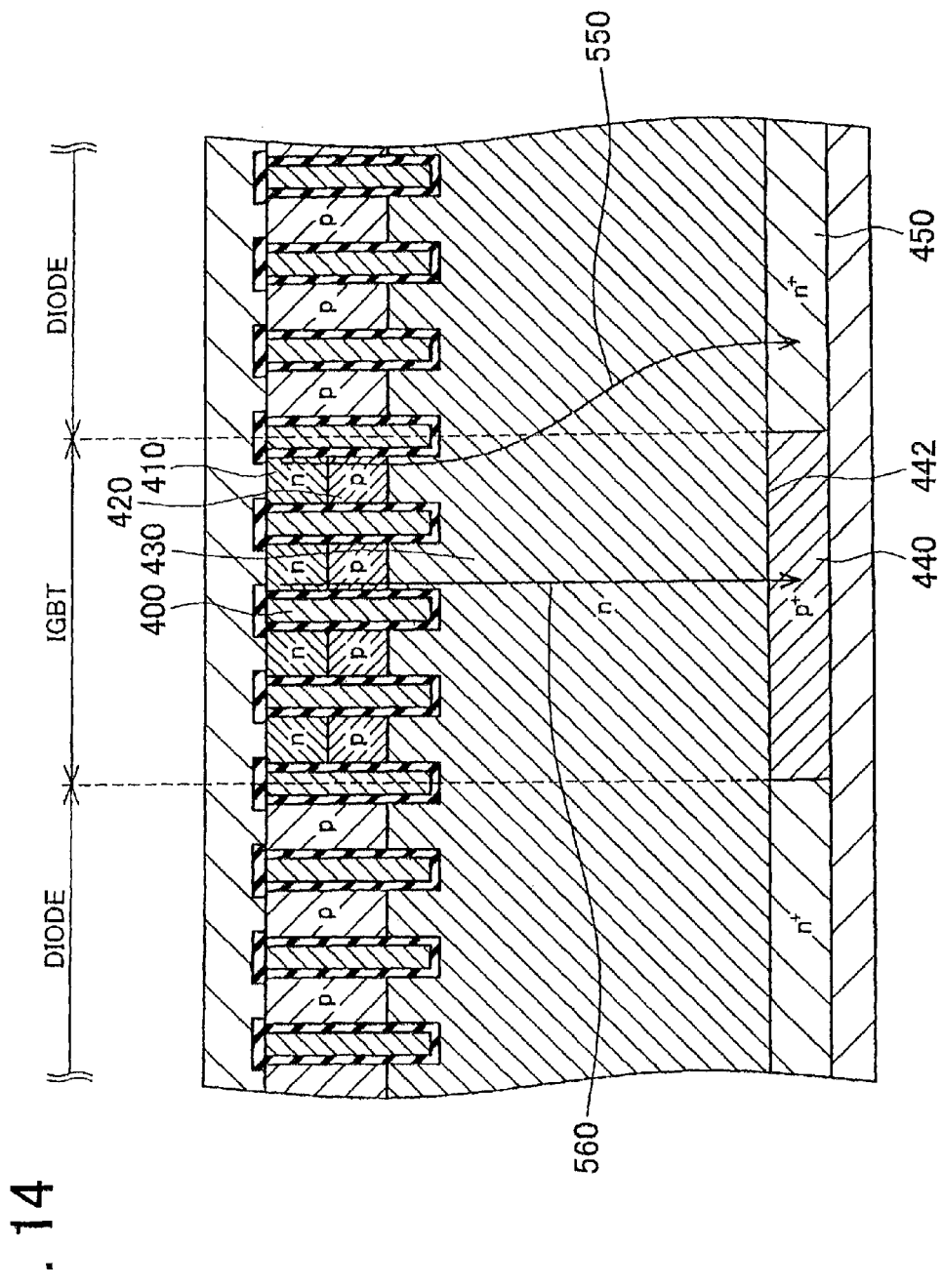
FIG. 14 is a longitudinal sectional view of an RC-IGBT according to related art.
Figure 15:
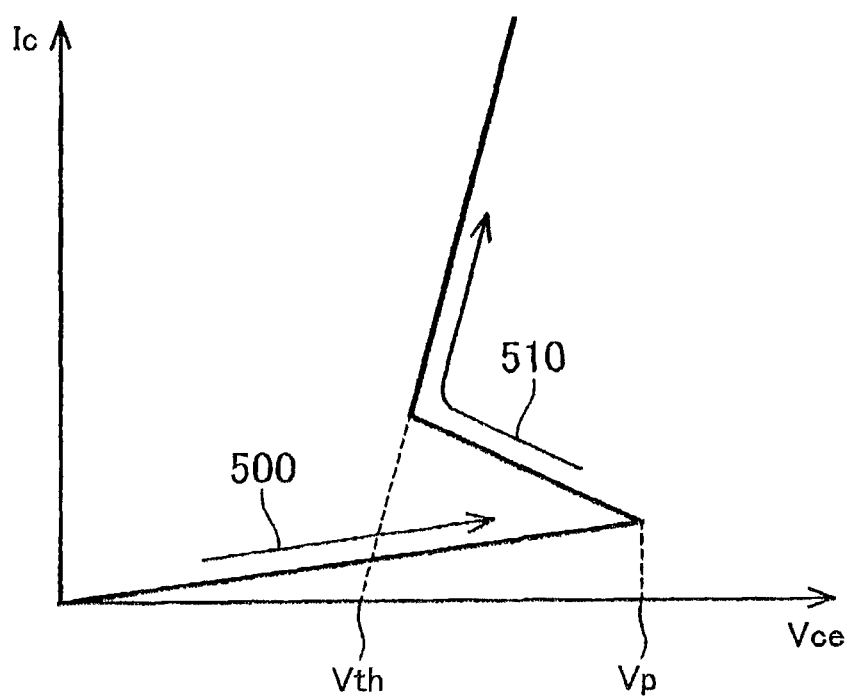
FIG. 15 is a graph illustrating a snapback phenomenon of the RC-IGBT according to the related art.

Also, in the example embodiments described above, the body region 112 of a single layer is formed. However, in another example embodiment, a body region may be separated into an upper body region 112a and a lower body region 112c, as shown in FIG. 13. With the structure in FIG. 13 as well, the upper body region 112a and the lower body region 112c essentially function as a single body region.

Also, in the example embodiments described above, the IGBT has a trench-type gate electrode, but the IGBT may have a planar-type gate electrode instead.

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less or only a single element, are also within the scope of the invention.

The invention claimed is:

1. A semiconductor device comprising:
a semiconductor substrate having a thickness, wherein the thickness direction of the substrate is a first direction, the semiconductor substrate includes an isolation region, an IGBT region that contacts the isolation region arranged in a second direction along an upper surface of the semiconductor substrate, and a diode region that contacts the isolation region arranged in the second direction along an upper surface of the semiconductor substrate and the IGBT region, the isolation region, the IGBT region, and the diode region being formed in the upper surface of the semiconductor substrate; an n-type emitter region, and a p-type body region that extends in the first direction to below the emitter region, the n-type emitter region and the p-type body region being formed in the IGBT region; a p-type anode region formed in the diode region; a p-type deep region is connected to the body region and the anode region, and extends in the first direction lower than both the body region and the anode region, and is formed in the isolation region; an n-type drift region extends across the isolation region, the IGBT region, and the diode region, and that is positioned in the first direction lower than the body region and separated from the emitter region by the body region in the IGBT region, and that is positioned in the first direction lower than the anode region in the diode region, and that is positioned in the first direction lower than the deep region in the isolation region, and is formed inside the semiconductor substrate; a gate electrode that opposes, via an insulating film, the body region in an area separating the emitter region from the drift region, and that is formed in the IGBT region; and a p-type collector region that extends across the isolation region, the IGBT region and the diode region, and an n-type cathode region positioned in the diode region, the p-type collector region and the n-type cathode region being formed in a lower surface of the semiconductor substrate, wherein
a boundary between the collector region and the cathode region is in the diode region, in a cross-section that cuts across a boundary between the isolation region and the diode region, and divides the isolation region and the diode region.

2. A semiconductor device comprising:
a semiconductor substrate having a thickness, wherein the thickness direction of the substrate is a first direction, the semiconductor substrate includes an isolation region, an IGBT region that contacts the isolation region arranged in a second direction along an upper surface of the semiconductor substrate, and a diode region that contacts the isolation region arranged in the second direction along an upper surface of the semiconductor substrate and the IGBT region, the isolation region, the IGBT region, and the diode region being formed in the upper surface of the semiconductor substrate; an n-type emitter region, and a p-type body region that extends in the first direction to below the emitter region, the n-type emitter region and the p-type body region being formed in the IGBT region; a p-type anode region formed in the diode region; a p-type deep region is connected to the body region and the anode region, and extends in the first direction lower than both the body region and the anode region, and is formed in the isolation region; an n-type drift region extends across the isolation region, the IGBT region, and the diode region, and that is positioned in the first direction lower than the body region and separated from the emitter region by the body region in the IGBT region, and that is positioned in the first direction lower than the anode region in the diode region, and that is positioned in the first direction lower than the deep region in the isolation region, and is formed inside the semiconductor substrate; a gate electrode that opposes, via an insulating film, the body region in an area separating the emitter region from the drift region, and that is formed in the IGBT region; and a p-type collector region that extends across the isolation region, the IGBT region and the diode region, and an n-type cathode region positioned in the diode region, the p-type collector region and the n-type cathode region being formed in a lower surface of the semiconductor substrate, wherein
the emitter region and the body region are formed alternately repeating in the second direction in the upper surface of the semiconductor substrate in the IGBT region; and in a region exposed in the upper surface of the semiconductor substrate in the IGBT region, the emitter region is formed along a boundary between the IGBT region and the isolation region that intersects the second direction, in an area contacting the boundary.

3. A semiconductor device comprising:
a semiconductor substrate having a thickness, wherein the thickness direction of the substrate is a first direction, the semiconductor substrate includes an isolation region, an IGBT region that contacts the isolation region arranged in a second direction along an upper surface of the semiconductor substrate, and a diode region that contacts the isolation region arranged in the second direction along an upper surface of the semiconductor substrate and the IGBT region, the isolation region, the IGBT region, and the diode region being formed in the upper surface of the semiconductor substrate; an n-type emitter region, and a p-type body region that extends in the first direction to below the emitter region, the n-type emitter region and the p-type body region being formed in the IGBT region; a p-type anode region formed in the diode region; a p-type deep region is connected to the body region and the anode region, and extends in the first direction lower than both the body region and the anode region, and is formed in the isolation region; an n-type drift region extends across the isolation region, the IGBT region, and the diode region, and that is positioned in the first direction lower than the body region and separated from the emitter region by the body region in the IGBT region, and that is positioned in the first direction lower than the anode region in the diode region, and that is positioned in the first direction lower than the deep region in the isolation region, and is formed inside the semiconductor substrate; a gate electrode that opposes, via an insulating film, the body region in an area separating the emitter region from the drift region, and that is formed in the IGBT region; an n-type cathode region is formed in the diode region, in the region exposed on the lower surface of the semiconductor substrate; the p-type first collector region is formed in the IGBT region, in the lower surface of the semiconductor substrate; and a second collector region having a higher p-type impurity concentration than the first collector region is formed in the isolation region, in the lower surface of the semiconductor substrate.

\* \* \* \* \*